(12) United States Patent
Kim et al.

(10) Patent No.: US 7,808,410 B2
(45) Date of Patent: Oct. 5, 2010

(54) CURRENT CONTROL CIRCUIT

(75) Inventors: Sang-kyu Kim, Seoul (KR); Dae-young Chung, Seoul (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/382,789

(22) Filed: Mar. 24, 2009

(65) Prior Publication Data

US 2009/0256733 A1    Oct. 15, 2009

(30) Foreign Application Priority Data

Apr. 11, 2008   (KR) .................... 10-2008-0033875

(51) Int. Cl.
*H03M 1/00* (2006.01)
(52) U.S. Cl. ......................... 341/136; 331/14
(58) Field of Classification Search ......... 341/130–155; 331/2, 8, 14, 17, 25
See application file for complete search history.

(56) References Cited

U.S. PATENT DOCUMENTS

| | | | |
|---|---|---|---|
| 6,134,430 A | 10/2000 | Younis et al. | |
| 6,686,860 B2 | 2/2004 | Gulati et al. | |
| 6,864,817 B1 | 3/2005 | Salvi et al. | |
| 7,190,299 B2 | 3/2007 | Nakamori et al. | |
| 2006/0197558 A1* | 9/2006 | Starr et al. | 327/99 |

* cited by examiner

*Primary Examiner*—Lam T Mai
(74) *Attorney, Agent, or Firm*—Harness, Dickey & Pierce, P.L.C.

(57) ABSTRACT

Provided is a current control circuit. A current control circuit may include a clock sensing unit configured to generate a control signal according to one or more frequencies based on a plurality of clock signals, and a current scaling unit configured to scale a bias current according to the control signal. The current control circuit according to example embodiments may dynamically control a bias current according to one or more frequencies based on a plurality of clock signals so that power consumption of an analog-to-digital converter (ADC) and the semiconductor device including the ADC, which require various operating frequencies, may be improved.

20 Claims, 3 Drawing Sheets

CURRENT CONTROL CIRCUIT

PRIORITY STATEMENT

This application claims the benefit of Korean Patent Application No. 10-2008-0033875, filed on Apr. 11, 2008, in the Korean Intellectual Property Office, the disclosure of which is incorporated herein in its entirety by reference.

BACKGROUND

1. Field

Example embodiments relate to a semiconductor device, for example, to a current control circuit and a method of controlling current in an analog-to-digital converter (ADC).

2. Description of the Related Art

Conventionally, analog-to-digital converters (ADCs) are used in system-on-chip (SOC) applications in various ways. Here, desired performances and sampling speed vary in each application. Accordingly, desired performances vary in ADCs when used and an operating frequency (frequency of a sampling clock signal) also varies in ADCs.

However, a bias current of ADCs according to the conventional art is regularly generated, regardless of the frequency of a sampling clock signal. As such, when ADCs use a bias current generated at a constant rate, regardless of the frequency of a sampling clock signal, power may be unnecessarily consumed.

For example, in an ADC designed to use a bias current of 100 mA that corresponds to a sampling clock signal of 80 MHz, even when a sampling clock signal that has a lower frequency than 80 MHz is input, a fixed bias current of 100 mA is used so that power may be wasted.

For example, since power consumed in an ADC is high, unnecessary power consumption as described above may affect semiconductor devices or systems.

SUMMARY

Example embodiments provide a current control circuit for preventing unnecessary power consumption in an analog-to-digital converter (ADC).

Example embodiments may provide a current control circuit including a clock sensing unit configured to generate a control signal according to one or more frequencies based on a plurality of clock signals, and a current scaling unit configured to scale a bias current according to the control signal.

According to example embodiments, the clock sensing unit may include a variable resistor configured to vary a resistor value corresponding to the one or more frequencies based on a plurality of clock signals, a fixed resistor having a first end connected to an end of the variable resistor and a second end connected to a power voltage source, and a control signal generator configured to generate the control signal that corresponds to an index voltage obtained by dividing the power voltage according to a resistor ratio of the variable resistor to the fixed resistor.

The variable resistor may be implemented with a switched capacitor.

According to example embodiments, a filter may be configured to filter the index voltage. Additionally, the filter may be a low-pass filter.

The control signal generator may be an auxiliary analog-to-digital converter (ADC) configured to receive the index voltage and output the control signal as an n-bit digital code, where n is a natural number, the control signal being one of a plurality of thermometer digital codes.

The plurality of clock signals may be applied to the clock sensing unit from a clock source circuit located outside an analog-to-digital converter (ADC), where the current control circuit is located inside the ADC.

The current scaling unit may output the scaled current in response to a current ratio determined according to the control signal.

According to example embodiments, the current scaling unit may include a first transistor having a first end connected to a power voltage source and a second end connected to the bias current, at least one control transistor having a gate connected to the control signal, at least one scale transistor having a first end connected to a corresponding end of the control transistor and a second end connected to the power voltage source, and a second transistor having an end connected to the power voltage source in parallel with the first transistor and the scale transistors and outputting the operating current.

The operating current may be output to an amplifier.

The current ratio may correspond to a number of the at least one scale transistors that are connected to the at least one control transistors that are turned on in response to the control signal.

The control signal may be an n-bit digital code, where n is a natural number, and a number of the control transistors corresponds to a number of bits of the control signal.

The control transistors may be turned on according to bit values of the control signal.

The bias current may be supplied to the current scaling unit by a bias current generator An analog-to-digital converter (ADC) may include the current control circuit.

According to an example embodiment, a current control circuit may include a current scaling unit configured to scale a bias current according to a current ratio and to output the scaled current as an operating current, in response to a control signal corresponding to one or more frequencies based on a plurality of clock signals, with the control signal including a plurality of bits, and each of the bits corresponding to a state of one of a plurality of control transistors of the current scaling unit.

Example embodiments may provide a current control circuit including a current scaling unit configured to scale a bias current according to a current ratio and to output the scaled current as an operating current of an analog-to-digital converter (ADC), in response to a control signal corresponding to a frequency of a clock signal, with the control signal including a plurality of bits, and each of the bits corresponding to a state of a separate transistor of the current scaling unit.

Each of the bits of the control signal may connect to a separate gate of one of the plurality of control transistors.

BRIEF DESCRIPTION OF THE DRAWINGS

The above and other features and advantages will become more apparent by describing in detail of example embodiments with reference to the attached drawings in which.

DETAILED DESCRIPTION

Figure 1:
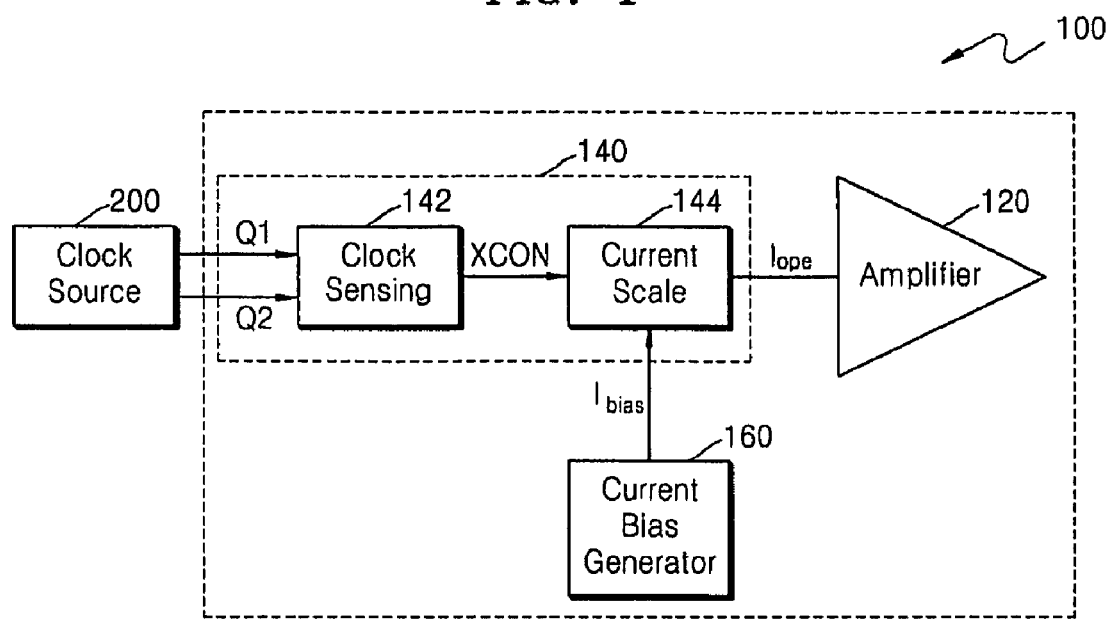
FIG. 1 is a block diagram illustrating part of an analog-to-digital converter (ADC), according to an example embodiment.

Hereinafter, example embodiments will be described more fully with reference to the accompanying drawings, in which example embodiments are shown.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms. In the figures, if a layer is formed on another layer or a substrate, it means that the layer is directly formed on another layer or a substrate, or that a third layer is interposed there between.

FIG. 1 is a block diagram illustrating a part of an analog-to-digital converter (ADC) 100, according to an example embodiment.

Referring to FIG. 1, the ADC 100 according to an example embodiment includes a current control circuit 140, a current bias generator 160, and an operating block 120. In FIG. 1, an amplifier 120 is shown to represent at least part of the operating block 120 of the ADC 100, and may have the highest current consumption from among various other operating blocks in the ADC.

The current control circuit 140 scales a bias current, $I_{bias}$, generated in the bias current generator 160, by a current ratio and generates the scaled current as operating current, $I_{ope}$, of the ADC, which is then used in the amplifier 120. The current ratio, for example, may be determined empirically or according to desired parameters. Here, the current control circuit 140, according to an example embodiment, may generate and vary the intensity of the operating current, $I_{ope}$, according to the frequencies of sampling clock signals Q1 and Q2 so that current consumption (power consumption) may be improved for the frequencies of sampling clock signals Q1 and Q2.

For example, the current control circuit 140 included in the ADC 100 of the current embodiment includes a clock sensing unit 142 and a current scaling unit 144. The clock sensing unit 142 generates a control signal XCON, which corresponds to the frequencies of the sampling clock signals Q1 and Q2. In response to the control signal XCON, the current scaling unit 144 scales the bias current, $I_{bias}$, by a current ratio and generates the scaled current as the operating current, $I_{ope}$, of the ADC 100. As mentioned above, the operating current, $I_{ope}$, may be used in the amplifier 120 of the ADC 100.

Hereinafter, the current control circuit 140 included in the ADC 100 will be described in more detail.

Figure 2:
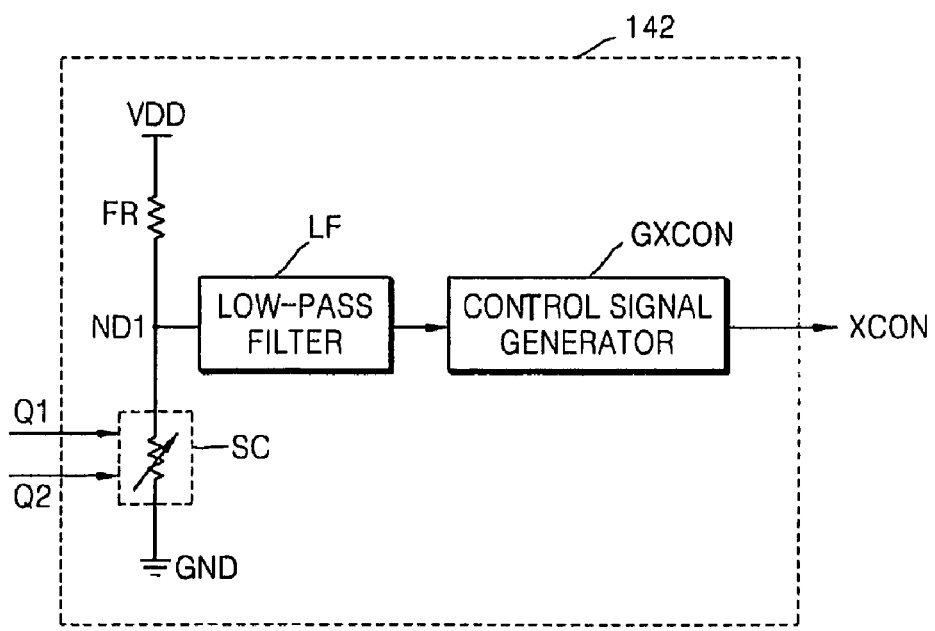
FIG. 2 is a circuit diagram illustrating a clock sensing unit of FIG. 1 in more detail, according to an example embodiment.

FIG. 2 is a circuit diagram illustrating the clock sensing unit 142 of FIG. 1 in more detail, according to an example embodiment.

Referring to FIGS. 1 and 2, the clock sensing unit 142 may include a variable resistor SC, a fixed resistor FR, and a control signal generator GXCON. The sampling clock signals Q1 and Q2 are applied to the variable resistor SC. Here, the sampling clock signals Q1 and Q2 may be provided from a clock source circuit 200 located outside the ADC 100. The clock source circuit 200 may be a phase locked loop (PLL), a delay locked loop (DLL), or an oscillator of a chip in which the ADC is included. Also, an external clock may be used to supply the sampling clock signals Q1 and Q2.

The variable resistor SC may be varied to a resistor value that corresponds to the frequencies of the sampling clock signals Q1 and Q2. Here, the variable resistor SC may be implemented with a switched capacitor SC illustrated in FIG. 3.

Figure 3:
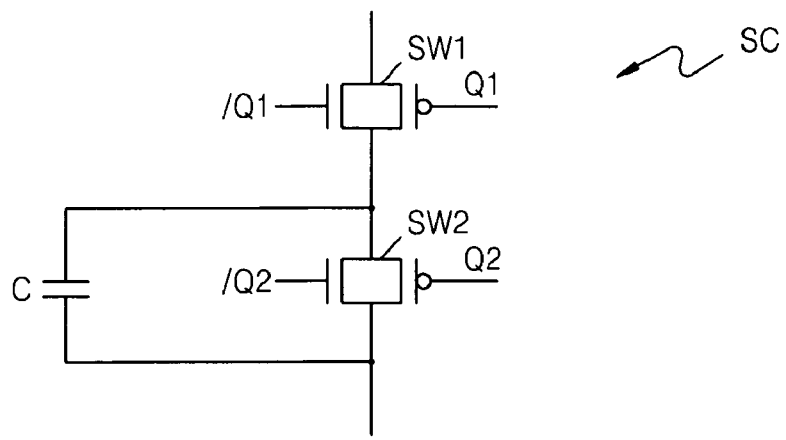
FIG. 3 is a circuit diagram illustrating a switched capacitor used as a variable resistor in FIG. 2, according to an example embodiment.
Figure 4:
FIG. 4 is a waveform diagram of a clock signal used in a switched capacitor of FIG. 3, according to an example embodiment.

The switched capacitor SC of FIG. 3 is realized by switches SW1 and SW2 being switched in response to clock signals Q1 and Q2 that do not overlap each other as illustrated in FIG. 4, and a capacitor C. When a period of the clock signals Q1 and Q2 is denoted by T, the switched capacitor SC may be equivalently transformed to resistor R having a resistor value of T/C. For example, the switched capacitor SC may operate as the variable resistor in which the resistor value is varied according to the frequencies of the sampling clock signals Q1 and Q2.

Referring back to FIGS. 1 and 2, one end of the fixed resistor FR is connected to one end of the variable resistor SC and another end of the fixed resistor FR is connected to a power voltage source VDD. An other end of the variable resistor SC is connected a ground voltage GND. Accordingly, a voltage at a first node ND1 may have a value obtained by dividing the power voltage VDD according to a resistor ratio of the variable resistor SC and the fixed resistor FR.

It may be assumed that the voltage obtained by dividing the power voltage VDD according to a resistor ratio of the variable resistor SC to the fixed resistor FR denotes an index voltage. The clock sensing unit 142, according to example embodiments, may further include a filter for filtering the index voltage, in order to reduce or minimize the index voltage from being changed by affects from the sampling clock signals Q1 and Q2. Here, the filter may be a low-pass filter LF.

The control signal generator GXCON generates the control signal XCON that corresponds to the value of the index voltage. The control signal XCON may be an n-bit digital code (where n is a natural number). The control signal generator GXCON may be realized by an auxiliary ADC. For example, when the n-bit auxiliary ADC is used, the control signal XCON may be output as one digital code from among $2^n-1$ thermometer digital codes.

The control signal generator XCON generated as above is transmitted to the current scaling unit 144.

Figure 5:
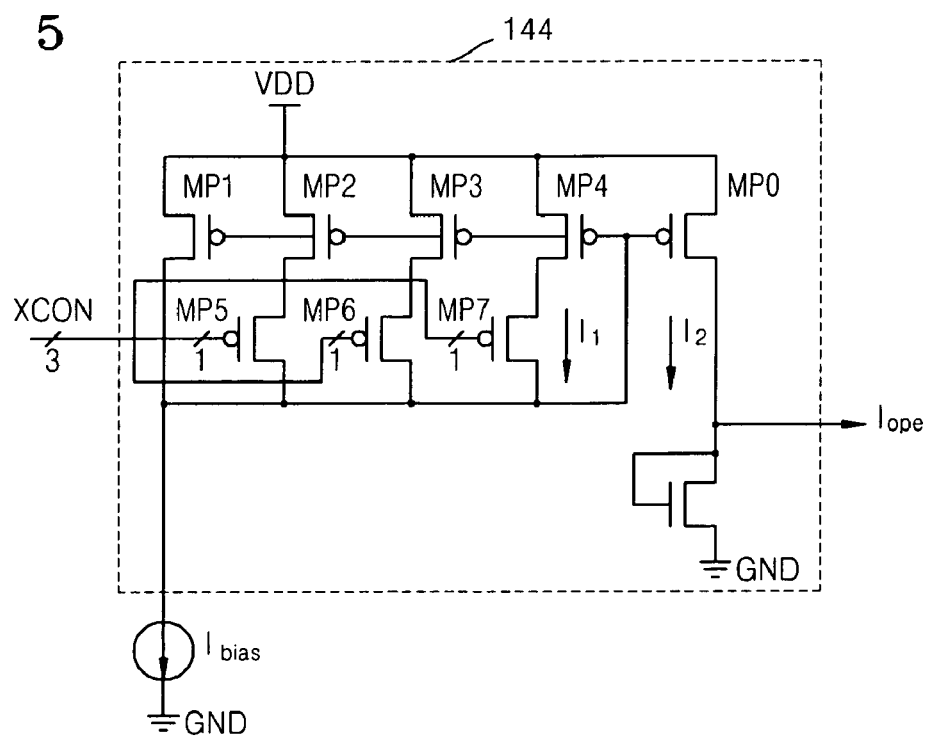
FIG. 5 is a circuit diagram illustrating a current scaling unit of FIG. 1 in more detail, according to an example embodiment.

FIG. 5 is a circuit diagram illustrating the current scaling unit 144 of FIG. 1 in more detail, according to an example embodiment.

Referring to FIGS. 1 and 5, the current scaling unit 144 may include a first transistor MP1, control transistors MP5 to MP7, scale transistors MP2 to MP4, and a second transistor MP0.

One end of the first transistor MP1 is connected to the power voltage source VDD and the bias current $I_{bias}$ is applied to the other end of the first transistor MP1. As described above, the bias current $I_{bias}$ may be applied by the bias current generator 160 located outside the current control circuit 140.

The control signal XCON is applied to each of the control transistors MP5 to MP7. When the control signal XCON is an n-bit digital code, as mentioned above, the number of control transistors MP5 to MP7 included may correspond to n of the control signal XCON. FIG. 5, for example, illustrates the current scaling unit 144 including three control transistors MP5 to MP7 in which one of the bits of a 3-bit control signal XCON may be applied to each gate of the control transistors MP5 to MP7. Thus, a separate and distinct bit of the control signal XCON may be applied to each of the corresponding gates of the control transistors MP5 to MP7.

Here, each of the control transistors MP5 to MP7 may be turned on according to bit values of the control signal XCON. For example, when the control signal XCON is "110," the first control transistor MP5 and the second transistor MP6 may be turned off and the third control transistor MP7 may be turned on.

One end of each of the scale transistors MP2 to MP4 is respectively connected to one end of each of the corresponding control transistors MP5 to MP7, and the other end of each of the scale transistors MP2 to MP4 are connected to the power voltage source VDD. For example, as illustrated in FIG. 5, the first scale transistor MP2, the second scale transistor MP3, and the third scale transistor MP4 may be respectively connected to the first control transistor MP5, the second control transistor MP6, and the third control transistor MP7. An other end and a gate of each of the control transistors MP5 to MP7 is connected to a node including the bias current $I_{bias}$.

Thus, activation of the scale transistors MP2 to MP4 may vary according to on and off states of the connected control transistors MP5 to MP7. For example, when the control signal XCON is "110," only the third scale transistor MP4 is activated and thus a current may be generated.

One end of the second transistor MP0 is connected to the power voltage source VDD and the second transistor MP0 is connected in parallel with the first transistor MP1 and the scale transistors MP2 to MP4, thereby outputting the operating current, $I_{ope}$. A gate of the second transistor MP0 is connected to the node including the bias current $I_{bias}$. In addition, the other end of the second transistor MP0 connects to a ground voltage GND through a ground transistor. A gate of the ground transistor is connected to the other end of the second transistor MP0. As mentioned above, the operating current, $I_{ope}$, is generated by a current ratio with respect to the bias current, $I_{bias}$.

Here, the current ratio corresponds to the number of the scale transistors activated in response to the control signal XCON.

For example, it may be assumed that the scale transistors MP2 to MP4, the first transistor MP1, and the second transistor MP0 have the same capacitance as each other. Here, when the bias current $I_{bias}$ is 100 mA and the control signal XCON is "110," the third scale transistor MP4 may be activated, so that the current ratio of the bias current $I_{bias}$ to the current ratio $I_{ope}$ may be 2:1. Therefore, the current ratio, $I_{ope}$, may be generated at 50 mA.

However, in order to regulate the current ratio with a decimal ratio (for example, 1.5:1), instead of a fixed number ratio, the capacity of the scale transistors MP2 to MP4 may be different from that of the first transistor MP1 and the second transistor MP0. Moreover, according to a current ratio to be determined, the capacity of each of the scale transistors may be determined differently.

Figure 6:
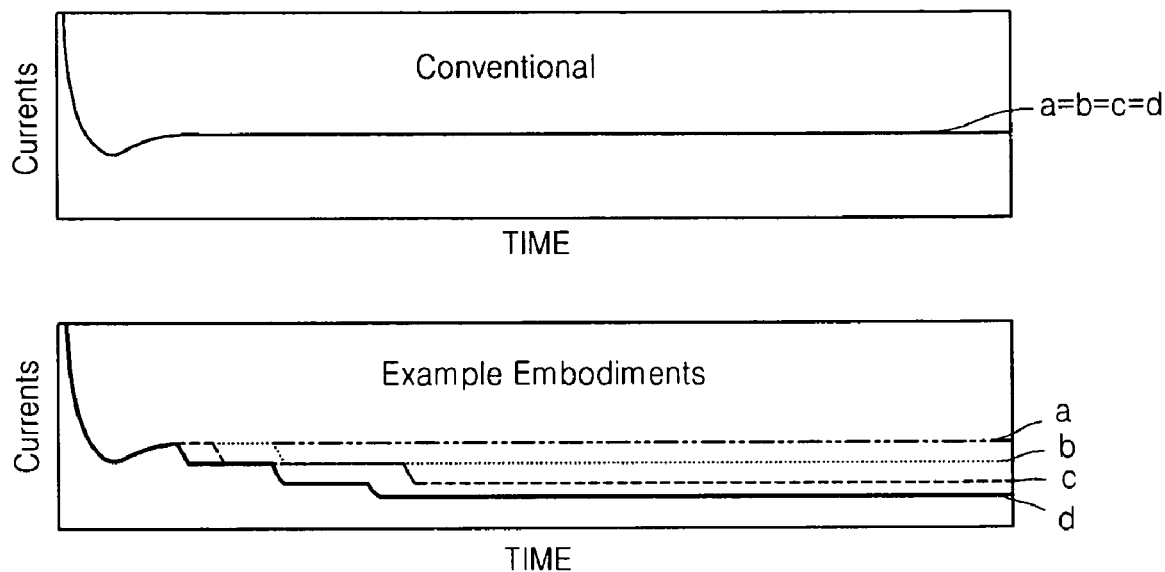
FIG. 6 is a graph illustrating the intensity of an operating current in a conventional ADC and an ADC according to an example embodiment.

FIG. 6 is a graph illustrating the intensity of the operating current in a conventional ADC and the ADC according to an example embodiment.

Referring to FIG. 6, when sampling clock signals of 80 Megahertz (MHz), 60 MHz, 40 MHz, and 20 MHz are respectively applied to the ADC, the operating currents respectively generated are denoted by a, b, c, and d.

In the conventional ADC, the same operating current (a=b=c=d) is generated, regardless of the frequency of the sampling clock signal.

However, in the ADC including the current control circuit according to an example embodiment, the operating current having different values in terms of each sampling clock signal is generated. For example, in the ADC according to an example embodiment, the operating current d is generated at the highest sampling frequency of 80 MHz and the operating current d is generated at the lowest sampling frequency of 20 MHz so that the operating current is generated in proportion to the frequency of a sampling clock signal.

Referring to FIGS. 1-4 and 6-7, the frequency of the clock signal may represent a frequency of one of the clock signals Q1 and Q2. For example, the frequency of the clock signal may represent the higher or lower frequency of the clock signals Q1 and Q2. Alternatively, the frequency of the clock signal may represent a combination of the frequencies of clock signals Q1 and Q2. For example, the frequency of the clock signal may represent a weighted or non-weighted average of the frequencies of clock signals Q1 and Q2.

Figure 7:
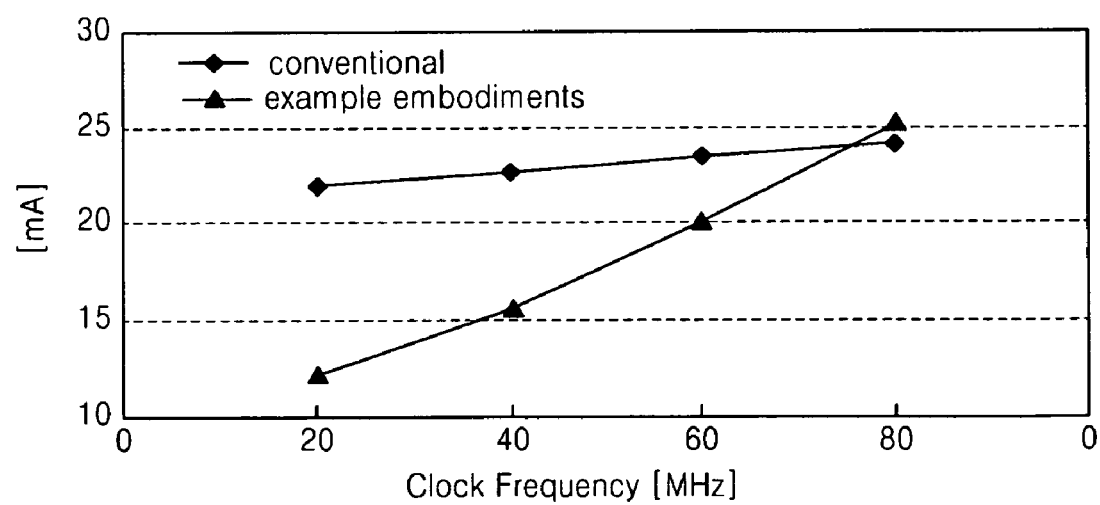
FIG. 7 is a graph illustrating a current consumption comparison between a conventional ADC and an ADC according to an example embodiment.

FIG. 7 is a graph illustrating a current consumption comparison between the conventional ADC and the ADC according to an example embodiment.

Referring to FIG. 7, in the conventional ADC, a constant current is consumed, regardless of the frequency of a sampling clock signal, whereas current adaptable to the frequency of a sampling clock signal is consumed in the ADC according to an example embodiment. For example, in FIG. 7, a lower current is consumed for a lower clock frequency.

As described above, the current control circuit and the method of controlling current in the ADC, according to an example embodiment, may dynamically control a bias current according to the frequencies of sampling clock signals so that power consumption of the ADC and the semiconductor device including the ADC, which use various operating frequencies, may be improved.

Moreover, the current control circuit and the method of controlling current in the ADC according to an example embodiment may be provided to various products having different operating frequencies with one ADC that is in an IP form so that time and cost used to produce an IP may be saved.

While example embodiments have been particularly shown and described, it will be understood by those of ordinary skill in the art that various changes in form and details may be made therein without departing from the spirit and scope of example embodiments as defined by the following claims.

What is claimed is:

1. A current control circuit, comprising:
   a clock sensing unit configured to generate a control signal according to one or more frequencies based on a plurality of clock signals; and
   a current scaling unit configured to scale a bias current and output the scaled current in response to a current ratio determined according to the control signal.

2. The current control circuit of claim 1, wherein the clock sensing unit includes,
   a variable resistor configured to vary a resistor value corresponding to the one or more frequencies based on a plurality of clock signals,
   a fixed resistor having a first end connected to an end of the variable resistor and a second end connected to a power voltage source, and
   a control signal generator configured to generate the control signal that corresponds to an index voltage obtained by dividing the power voltage according to a resistor ratio of the variable resistor to the fixed resistor.

3. The current control circuit of claim 2, wherein the variable resistor is implemented with a switched capacitor.

4. The current control circuit of claim 2, the clock sensing unit further includes a filter configured to filter the index voltage.

5. The current control circuit of claim 4, wherein the filter is a low-pass filter.

6. The current control circuit of claim 2, wherein the control signal generator is an auxiliary analog-to-digital converter (ADC) configured to receive the index voltage and output the control signal as an n-bit digital code, where n is a natural number, the control signal being one of a plurality of thermometer digital codes.

7. The current control circuit of claim 1, wherein the plurality of clock signals are applied to the clock sensing unit from a clock source circuit located outside an analog-to-digital converter (ADC), where the current control circuit is located inside the ADC.

8. The current control circuit of claim 1, wherein the current scaling unit includes,
   a first transistor having a first end connected to a power voltage source and a second end connected to the bias current,
   at least one control transistor having a gate connected to the control signal,
   at least one scale transistor having a first end connected to a corresponding end of the control transistor and a second end connected to the power voltage source, and
   a second transistor having an end connected to the power voltage source in parallel with the first transistor and the scale transistors and outputting the operating current.

9. The current control circuit of claim 8, wherein the operating current is output to an amplifier.

10. The current control circuit of claim 8, wherein the current ratio corresponds to a number of the at least one scale transistors that are connected to the at least one control transistors that are turned on in response to the control signal.

11. The current control circuit of claim 10, wherein the control signal is an n-bit digital code, where n is a natural number, and a number of the control transistors corresponds to a number of bits of the control signal.

12. The current control circuit of claim 11, wherein the control transistors are turned on according to bit values of the control signal.

13. The current control circuit of claim 1, wherein the bias current is supplied to the current scaling unit by a bias current generator.

14. An analog-to-digital converter (ADC) including the current control circuit of claim 1.

15. A method of controlling a bias current of an analog-to-digital converter (ADC) according to a frequency of a sampling clock signal in the ADC, the method comprising:
   generating a control signal that corresponds to the frequency of the sampling clock signal;
   scaling the bias current according to a predetermined current ratio; and
   outputting the scaled current as an operating current of the ADC, in response to the control signal.

16. A current control circuit, comprising:

a current scaling unit configured to scale a bias current according to a current ratio and to output the scaled current as an operating current, in response to a control signal corresponding to one or more frequencies based on a plurality of clock signals, with the control signal including a plurality of bits, and each of the bits corresponding to a state of one of a plurality of control transistors of the current scaling unit.

17. The current control circuit of claim 16, wherein each of the bits of the control signal connects to a separate gate of one of the plurality of control transistors.

18. The current control circuit of claim 17, wherein the current scaling unit includes, a first transistor having a first end connected to a power voltage source and a second end connected to the bias current, a plurality of scale transistors having a first end connected to a corresponding end of one of the plurality of control transistors and a second end connected to the power voltage source, and a second transistor having an end connected to the power voltage source in parallel with the first transistor and the scale transistors and outputting the operating current.

19. The current control circuit of claim 18, wherein the current ratio corresponds to a number of the plurality of scale transistors that are connected to the plurality of control transistors that are turned on in response to the control signal, where the plurality of control transistors are selectively turned on according to bit values of the control signal.

20. The current control circuit of claim 19, wherein the control signal is an n-bit digital code, where n is a natural number, and a number of the control transistors corresponds to a number of bits of the control signal.

* * * * *